US005998098A

United States Patent [19]

Kraska

[11] Patent Number: 5,998,098

[45] Date of Patent: Dec. 7, 1999

[54] PROCESS FOR ADHERING THE EDGES OF PHOTOPOLYMERIZABLE PRINTING PLATES OR PHOTOPOLYMER PRINTING FORMS FOR FLEXOGRAPHIC PRINTING

[75] Inventor: Ursula Kraska, Weiterstadt, Germany

[73] Assignee: E. I. du Pont de Nemours and Company, Wilmington, Del.

[21] Appl. No.: 08/982,104

[22] Filed: Dec. 1, 1997

[30] Foreign Application Priority Data

Dec. 23, 1996 [DE] Germany .......................... 196 54 103

[51] Int. Cl.[6] .............................. G03F 7/00; C08J 3/28; C08F 2/46; B32B 31/28

[52] U.S. Cl. .......................... 430/309; 522/121; 522/182; 522/120; 156/275.1; 156/275.3; 156/275.5; 430/907; 430/281.1; 430/270.1

[58] Field of Search .................................... 522/121, 120, 522/182; 430/270.1, 281.1, 916, 907, 905, 309; 156/275.1, 275.3

[56] References Cited

U.S. PATENT DOCUMENTS

| | | | |
|---|---|---|---|
| 4,126,466 | 11/1978 | Roos | 96/84 |
| 4,197,130 | 4/1980 | Nakamura et al. | 430/286 |
| 4,228,232 | 10/1980 | Rousseau | 430/271 |
| 4,234,676 | 11/1980 | Hein et al. | 430/286 |
| 4,266,005 | 5/1981 | Nakamura et al. | 430/271 |
| 4,266,007 | 5/1981 | Hughes et al. | 430/306 |
| 4,320,188 | 3/1982 | Heinz et al. | 430/281 |
| 4,430,417 | 2/1984 | Heinz et al. | 430/286 |
| 4,431,723 | 2/1984 | Proskow | 430/286 |
| 4,507,382 | 3/1985 | Rousseau et al. | 430/275 |
| 4,550,072 | 10/1985 | Lynch et al. | 430/256 |
| 4,635,549 | 1/1987 | Bleckmann et al. | 101/401.1 |
| 4,758,500 | 7/1988 | Schober et al. | 430/309 |
| 4,828,641 | 5/1989 | Werther et al. | 156/258 |
| 4,927,740 | 5/1990 | Wallbillich et al. | 430/309 |
| 4,935,330 | 6/1990 | Hofmann et al. | 430/281 |
| 4,940,650 | 7/1990 | Kurtz et al. | 430/283 |
| 5,112,725 | 5/1992 | Kurtz et al. | 430/306 |
| 5,472,824 | 12/1995 | Schober et al. | 430/309 |

FOREIGN PATENT DOCUMENTS

| | | | |
|---|---|---|---|
| 2017497 | 12/1990 | Canada | B05D 3/06 |
| 0 316 597 | 10/1988 | European Pat. Off. . | |
| 0 406 585 | 6/1990 | European Pat. Off. . | |
| 1 366 769 | 9/1974 | United Kingdom | C08F 1/20 |
| 2 160 882 | 6/1985 | United Kingdom . | |
| 2 160 882 | 1/1986 | United Kingdom | B41D 5/00 |
| 2161882A | 1/1986 | United Kingdom . | |

*Primary Examiner*—James J. Seidleck
*Assistant Examiner*—Sanza L. McClendon
*Attorney, Agent, or Firm*—Thomas H. Magee

[57] ABSTRACT

A process for covering edges and/or filling openings or gaps which are formed when photopolymerizable printing plates or printing forms for flexographic printing are mounted on a printing cylinder, by applying an edge covering or gap filling material of low molecular weight and oligomeric, ethylenically unsaturated compounds and hardening the materials by exposure with actinic light.

7 Claims, No Drawings

PROCESS FOR ADHERING THE EDGES OF PHOTOPOLYMERIZABLE PRINTING PLATES OR PHOTOPOLYMER PRINTING FORMS FOR FLEXOGRAPHIC PRINTING

BACKGROUND OF THE INVENTION

1. Field of the Invention

This invention pertains to a process for covering edges and/or filling openings or gaps that are formed when photopolymerizable printing plates or photopolymer printing forms are installed on a printing cylinder for flexographic printing. In the process, edge covering material or gap filling material is applied and hardened by exposure to actinic radiation.

2. Description of Related Art

The preparation of flexographic printing forms from photopolymerizable printing plates is known. The printing surface is produced by imagewise exposure of a photopolymerizable layer by actinic radiation. Unexposed, unphotopolymerized areas of the printing plate are washed off. Examples of the preparation of flexographic printing forms are found in the following patents: DE-C 22 15 090, U.S. Pat. No. 4,266,005, U.S. Pat. No. 4,320,188, U.S. Pat. No. 4,126,466 and U.S. Pat. No. 4,430,417.

The printing form is prepared by exposing the photopolymerizable printing plate through a photographic original, washing off the unexposed areas with a solvent, and optionally, followed by a chemical post treatment and/or an overall postexposure. These processing steps can also be conducted optionally on a printing cylinder.

The photopolymer flexographic printing form, or if the printing form is produced on the cylinder, the photopolymerizable printing plate, is mounted on the printing cylinder or on an endless belt. In practice, the printing form is often assembled from individual pieces. Such assembly might be required, for example, by the subject being printed, for reasons of economy, or to achieve a larger plate format. In addition, for a range of end uses, it is necessary to cover the printing cylinder with the printing form in an endless manner to achieve a continuous printing surface. For this purpose, the printing plate or printing form is placed around the cylinder so that the ends abut and are adhered by double-sided adhesive tapes. If printing forms comprising individual pieces are used, the edges of the individual pieces are similarly adhered.

Gaps that interrupt the printing surface are formed between the abutting edges of the flexographic printing forms. Such gaps must be sealed in a suitable manner to prevent penetration by ink during printing, which would result in loosening the attachments of the printing forms and in undesirable impressions from the gaps. Sealing the gaps is also required for good synchronous operation of the printing cylinder, which an open gap does not deliver.

Gaps can also occur between the side edges of printing forms and the printing cylinder surface. These must be sealed against ink penetration.

Various gap fillers have already been proposed. DE-B 36 00 774 and DE-B 37 44 243 disclose photopolymerizable mixtures having special thermoplastic, elastomer, block copolymers as the main components. GB-B 2,160,882 discloses such mixtures having 100 parts of a diene-type prepolymer and 5–100 parts of an ethylenically unsaturated compound. These are applied in the gap and hardened by irradiation. Photopolymerizable mixtures having unsaturated polyesters (DE-A 39 20 093) and oxide-type fillers (DE-A 37 36 180) are also used as essential components to seal gaps occurring with gravure printing forms.

However, these gap fillers are often not stable enough to printing ink solvents and are not able to withstand the mechanical demands of the printing process. This causes cracks in the gap filler, which can now again fill with ink and thus result in undesirable print images. The applicability of known gap fillers is often poor and complicated.

SUMMARY OF THE INVENTION

The present invention is therefore based on the problem of avoiding the disadvantages of the current state of the art and sealing flexibly, reliably, rapidly, and simply the gaps that occur on mounting flexographic printing forms and printing plates, whereby the gap filler is expected to show the same ink transfer as the printing form so that overall surfaces can be printed more completely.

This problem was solved surprisingly by a process for covering edges and/or filling openings or gaps that are formed when photopolymerizable printing plates or printing forms for flexographic printing are mounted on a printing cylinder. In the process, an edge covering or gap filler is applied and hardened by exposure with actinic radiation, characterized in that the edge covering or gap filler is a photopolymerizable mixture containing at least one photopolymerizable, ethylenically unsaturated, low molecular weight compound, at least one photopolymerizable, ethylenically unsaturated oligomeric compound, and at least one photoinitiator or photoinitiator system, wherein the weight ratio of the low molecular weight compound to the oligomeric compound is at least 2:1.

DESCRIPTION OF THE PREFERRED EMBODIMENT(S)

It is surprising that the use of the photopolymerizable mixtures of the present invention increases the stability of the edge covers and gap fillers to printing inks and that the application and processing of these materials are simple and of uniform quality.

Gaps between flexographic printing forms mounted on printing cylinders and gaps between printing form edges and the printing cylinder surfaces can be sealed flexibly and simply with the photopolymerizable materials of the present invention. This can prevent penetration by printing inks or their solvents and the consequent loosening of the printing forms from the printing cylinders during printing and can improve synchronous operation characteristics. Similarly, overall surfaces are more completely printed, because the gap filler shows the same ink transfer as the printing forms.

Ethylenically unsaturated, low molecular weight compounds used in the photopolymerizable mixtures of the present invention are the known monounsaturated or polyunsaturated monomers, such as, for example, esters or amides of acrylic acid or methacrylic acid with monofunctional or polyfunctional alcohols, amines, amino-alcohols, hydroxyethers, and hydroxyesters. The boiling point of the ethylenically unsaturated, low molecular weight compounds is preferably greater than 100° C. The molecular weights of these compounds should be below 800, preferably between 100 and 600. Also suitable are mixtures of monounsaturated and polyunsaturated compounds as described in DE-C1 37 44 243 and DE-A 36 30 474. Examples of addition-polymerizable compounds are butylacrylate, isodecylacrylate, tetradecylacrylate, laurylacrylate, polyoxyethylated (meth)acrylates, such as, for example, polyoxyethylene-4-nonyl-phenol acrylate, 2-hexyloxyethyl acrylate, 1,4-butanediol diacrylate, 1,6-hexanediol dimethacrylate, 1,6-hexanediol diacrylate, trimethylolpropane triacrylate, and dipentaerythritol-monohydroxy pentacrylate.

Ethylenically unsaturated oligomers used in the photopolymerizable mixtures can be common known compounds, such as, for example, acrylate/butadiene copolymers, methacrylate/butadiene copolymers, styrene/butadiene copolymers, 1,2- and 1,4-polybutadiene, acrylated polybutadienes, methacrylated polybutadienes, polyisoprenes, or derivatives of these oligomers. Preferred are styrene/butadiene copolymers, (meth)acrylated polybutadienes, and (meth)acrylate/butadiene copolymers. The molecular weight (Mn) of the oligomers is between 1000 and 10,000, preferably between 2000 and 5000. The boiling point of the ethylenically unsaturated oligomers is preferably greater than 100° C.

The photopolymerizable mixtures also contain one of the known photoinitiators or a photoinitiator system, for example, methylbenzoin, benzoin acetate, benzophenone, benzil dimethyl ketal, ethyl anthraquinone/4,4'-bis-(dimethylamino)benzophenone.

The weight ratio of the low molecular weight compounds to the oligomers in the photopolymerizable mixtures is equal to or greater than 2:1, preferably equal to or greater than 2.5:1, more preferably 2.5:1 to 4:1, particularly 2.8:1 to 3.5:1. The photopolymerizable mixtures also contain 0.5 to 5 percent by weight of an initiator. The mixtures can contain up to 10 percent by weight of other auxiliary agents, such as, for example, fillers, binders, dyes, antioxidants, antiozonants, thermal polymerization inhibitors, and plasticizers. Especially up to 10% by weight, preferably 1 to 8% by weight, particularly 1 to 6% by weight, of binders can be added. Preferred binders are binders which are compatible with the binders of the printing plates. For example, thermoplastic elastomeric block copolymers can be used. In particular, linear and/or radial polystyrene-polybutadiene-polystyrene or polystyrene-polyisoprene-polystyrene block copolymers, and polystyrene-polybutadiene rubbers are suitable. Preferred are polystyrene-polybutadiene-polystyrene block copolymers. Solvents are not required for the use of the mixtures.

The gap fillers are applied into the gaps to be sealed by methods known to the expert, preferably by a single spray or an injection gun, as described in DE-B 36 00 774 and GB-B 2,160,882. Fitting precision-beveled cuts on the edges of the printing forms or printing plates are not required.

Exposure with actinic light of any type hardens the photopolymerizable gap filler. Examples of suitable radiation sources are mercury vapor lamps, incandescent lamps having special fluorescent materials that emit ultraviolet light, argon glow lamps, and photolamps. The most suitable among these are mercury vapor lamps, particularly ultraviolet light lamps and UV fluorescent lamps.

The gap filler is hardened in this manner, and the printing forms become bonded so that the filled gap has the same printing properties as the printing form, and printing can be continuous.

All known flexographic printing forms and plates that are mounted on printing cylinders can be treated with the gap filler of the present invention. The composition, preparation, and processing of such flexographic printing forms and plates are known to the expert. Flexographic printing forms and plates based on thermoplastic, elastomeric, block copolymers are preferred, in particular, those of linear and/or radial polystyrene-polybutadiene-polystyrene or polystyrene-polyisoprene-polystyrene block copolymers. Such printing forms or plates and their preparation are described, for example, in DE-B 22 15 090, DE-B 37 44 243, and EP-B 0 084 851.

The following examples are to explain this invention. The stated parts and percents are by weight, unless otherwise stated.

EXAMPLES

Example 1

A commercial flexographic printing plate Cyrel® PLS from E.I. du Pont de Nemours and Company was exposed as described in DE-B 36 00 774, developed, and mounted with double-sided adhesive tape on a printing cylinder. The gap at the abutting edges (1–3 mm) was sealed with UV-transparent adhesive tape and sealed with a photopolymerizable mixture of the invention of 46% lauryl acrylate, 19% polyethoxylated 4-nonylphenol acrylate (4 moles of ethylene oxide), 5.8% hexamethyleneglycol diacrylate, 23.2% polybutadiene methacrylate (Mn 3000–4000), 4% of a polystyrene/polybutadiene/polystyrene block copolymer (Mw 130,000), 1.5% initiator, and 0.5% inhibitor. The weight ratio of the low molecular weight compound to the oligomeric compound was 3.1:1. The viscosity of the mixture was 360 cPs. After overall exposure in a commercial Cyrel® printing plate exposure device, the gap filler had 65 Shore A hardness and 38% impact resilience.

Printing tests at 100 and 200 m/min were conducted with the resulting printing cylinders. The gap filler was stable to printing inks and showed good ink transfer equal to that of the printing cylinder.

Example 2

An above-described printing plate was prepared as described in Example 1. The gap was sealed with a photopolymerizable mixture of the invention of 44% lauryl acrylate, 20% polyethoxylated 4-nonylphenol acrylate (4 moles of ethylene oxide), 6.5% hexamethyleneglycol diacrylate, 24% polybutadiene methacrylate (Mn 3000–4000), 4% of a polystyrene/polyisoprene/polystyrene block copolymer (Mw 130,000–150,000), 0.5% inhibitor. The weight ratio of the low molecular weight compound to the oligomeric compound was 2.9:1. The viscosity of the mixture was 390 cPs. After overall exposure in a commercial Cyrel® printing plate exposure device, the gap filler had 67 Shore A hardness and 34.8% impact resilience.

Printing tests at 100 and 200 m/min were conducted with the resulting printing cylinders. The gap filler was stable to printing inks and showed good ink transfer equal to that of the printing cylinder.

Comparison Example 1

An above-described printing plate was prepared as described in Example 1. The gap was sealed with a photopolymerizable mixture of 92.5% polyethoxylated 4-nonylphenol acrylate (4 moles of ethylene oxide), 1.5% hexamethyleneglycol diacrylate, 5% of a polystyrene/polybutadiene/polystyrene block copolymer (Mw 130,000), and 1.0% initiator. The viscosity of the mixture was 230 cPs. After overall exposure in a commercial Cyrel® printing plate exposure device, the gap filler had 42 Shore A hardness and 18.0% impact resilience.

A useful printing cylinder could not be obtained, because the gap filler stuck to the adhesive tape.

Comparison Example 2

An above-described printing plate was prepared as described in Example 1. The gap was sealed with a photopolymerizable mixture of 27% lauryl acrylate, 15% hexamethyleneglycol diacrylate, 38% polybutadiene methacrylate (Mn 3000–4000), 19% of a 1,4-polybutadiene (melting temperature ca. −50° C.), and 1.0% initiator. The weight ratio of the low molecular weight compound to the oligomeric compound was 0.7:1. The viscosity of the mixture was 749 cPs. After overall exposure in a commercial Cyrel® printing plate exposure device, the gap filler had 80 Shore A hardness and 31% impact resilience.

A useful printing cylinder could not be obtained, because the photopolymerizable gap filler was not homogeneous and the exposed material was too hard.

I claim:

1. A process for covering edges and/or filling openings or gaps which are formed when photopolymerizable printing plates or photopolymer printing forms are mounted on a printing cylinder, by applying an edge covering or gap filling material and hardening it by exposure to actinic radiation, characterized in that the edge covering or gap filling material is a photopolymerizable mixture containing at least one photopolymerizable, ethylenically unsaturated, low molecular weight compound having a molecular weight less than 800; at least one photopolymerizable, ethylenically unsaturated oligomeric compound having a molecular weight of between 1000 and 10,000; optionally up to 10% by weight of a binder; and at least one photoinitiator or one photoinitiator system, wherein the weight ratio of the low molecular weight compound to the oligomeric compound is equal to or greater than 2:1.

2. The process according to claim 1, characterized in that the weight ratio of the low molecular weight compound to the oligomeric compound is 2.5:1 to 4:1.

3. The process according to claim 1, characterized in that acrylates and/or methacrylates having a boiling point >100° C. and a molecular weight of 100 to 600 are used as the low molecular weight compounds.

4. The process according to claim 1, characterized in that esters of acrylic acid and/or methacrylic acid with monovalent and/or polyvalent alcohols are used as the low molecular weight compounds.

5. The process according to claim 1, characterized in that acrylates and/or methacrylates having a boiling point >100° C. and a molecular weight of between 2000 and 5000 are used as the oligomeric compounds.

6. The process according to claim 1, characterized in that sytrene/butadiene copolymers and/or (meth)acrylated polybutadienes and/or (meth)acrylate/butadiene copolymers are used as the oligomeric compounds.

7. The process according to claim 1, characterized in that the photopolymerizable edge covering or gap filling material contains up to 10 percent by weight of auxiliary materials.

* * * * *